United States Patent
Cok

(10) Patent No.: US 7,564,067 B2
(45) Date of Patent: Jul. 21, 2009

(54) DEVICE HAVING SPACERS

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/693,334

(22) Filed: Mar. 29, 2007

(65) Prior Publication Data

US 2008/0237612 A1    Oct. 2, 2008

(51) Int. Cl.
*H01L 29/161* (2006.01)

(52) U.S. Cl. .............................. 257/81; 257/84; 257/99; 257/E33.001

(58) Field of Classification Search ............. 257/81–85, 257/99, E33.001
See application file for complete search history.

(56) References Cited

U.S. PATENT DOCUMENTS

| | | | |
|---|---|---|---|
| 5,834,893 A | 11/1998 | Bulovic et al. | |
| 5,955,837 A | 9/1999 | Horikx et al. | |
| 6,091,195 A | 7/2000 | Forrest et al. | |
| 6,259,204 B1 | 7/2001 | Ebisawa et al. | |
| 6,551,440 B2 | 4/2003 | Tanaka | |
| 6,559,594 B2 | 5/2003 | Fukunaga et al. | |
| 6,777,871 B2 | 8/2004 | Duggal et al. | |
| 6,787,796 B2 | 9/2004 | Do et al. | |
| 6,821,828 B2 | 11/2004 | Ichijo et al. | |
| 2001/0026125 A1 | 10/2001 | Yamazaki et al. | |
| 2004/0027327 A1 | 2/2004 | LeCain et al. | |
| 2004/0061136 A1 | 4/2004 | Tyan et al. | |
| 2004/0217702 A1 | 11/2004 | Garner et al. | |
| 2005/0018431 A1 | 1/2005 | Shiang | |
| 2005/0194896 A1* | 9/2005 | Sugita et al. | ................. 313/506 |

(Continued)

FOREIGN PATENT DOCUMENTS

WO    02/37568    5/2002

(Continued)

OTHER PUBLICATIONS

Yanqin Li, et al., "Bright White-Light-Emitting Device from Ternary Nanocrystal Composites", Advanced Materials, 2006, pp. 2545-2548.

(Continued)

*Primary Examiner*—Evan Pert
*Assistant Examiner*—Scott R Wilson
(74) *Attorney, Agent, or Firm*—Stephen H. Shaw; Raymond L. Owens

(57) ABSTRACT

An electroluminescent device comprising: a substrate; one or more light-emitting elements formed over the substrate, the one or more light-emitting elements including first and second spaced-apart electrodes wherein at least one of the first and second electrodes is transparent and a light-emitting layer comprising quantum dots formed between the first and second electrodes; a cover located over the one or more light-emitting elements and spaced apart from the one or more light-emitting elements to form a gap between the cover and the one or more light-emitting elements; and separately formed spacer elements located in the gap between the cover and the one or more light-emitting elements and wherein the spacer elements are in physical contact with the one or more light-emitting elements, the cover, or both the one or more light-emitting elements and the cover.

19 Claims, 10 Drawing Sheets

U.S. PATENT DOCUMENTS

2006/0290276 A1 12/2006 Cok et al.
2007/0013291 A1 1/2007 Cok et al.
2007/0057263 A1 3/2007 Kahen

FOREIGN PATENT DOCUMENTS

WO 02/37580 5/2002

OTHER PUBLICATIONS

U.S. Appl. No. 11/266,622, Kahen.

Tang et al., "Organic electroluminescent diodes", Applied Physics Letter, vol. 51, pp. 913-915 (1987).

Burroughs et al., "Light-emitting diodes based on conjugated polymers", Nature 347, pp. 539-541 (1990).

Hikmet et al., "Study of conduction mechanism and electroluminescence in CdSe/ZnS quantum dot composites", Journal of applied Physics vol. 93, pp. 3509-3514, (2003).

Matoussi et al., "Electroluminescence from heterostructures of poly(phenylene vinylene) and inorganic CdSe nanocrystals", Journal of Applied Physics, vol. 83, pp. 7965-7974, Jun. 15, 1998.

Mueller et al., "Multicolor Light-Emitting Diodes Based on Semiconductor Nanocrystals Encapsulated in GaN Charge Injection Layers", Nano Letters, vol. 5, pp. 1039-1044, 2005.

Coe et al., "Electroluminescence from single monolayers of nanocrystals in molecular organic devices", Nature, vol. 420, pp. 800-803, 2002.

Safonov et al., "Modification of polymer light emission by lateral microstructure", Synthetic Materials 116, pp. 145-148, 2001.

Tsutsui et al., "Sharply directed emission in organic electroluminescent diodes with an optical-microcavity structure", Applied Physics Letters 65, pp. 1868-1870, Oct. 10, 1994.

Lupton et al., "Bragg scattering from periodically microstructured light emitting diodes," Applied Physics Letters, vol. 77, pp. 3340-3342, 2000.

* cited by examiner

DEVICE HAVING SPACERS

FIELD OF THE INVENTION

The present invention relates to electroluminescent devices containing emissive quantum dots; and more particularly, to electroluminescent device structures for improving light output, improving robustness, and reducing manufacturing costs.

BACKGROUND OF THE INVENTION

Semiconductor light-emitting diode (LED) devices, which are primarily inorganic, have been made since the early 1960's and currently are manufactured for usage in a wide range of consumer and commercial applications. The layers comprising the LEDs are based on crystalline semiconductor materials. These crystalline-based inorganic LEDs have the advantages of high brightness, long lifetimes, and good environmental stability. The crystalline semiconductor layers that provide these advantages also have a number of disadvantages. The dominant disadvantages have high manufacturing costs; difficulty in combining multi-color output from the same chip; inefficiency of light output; and the need for high-cost rigid substrates.

In the mid 1980's, organic light-emitting diodes (OLEDs) were invented (Tang et al, Applied Physics Letter 51, 913 (1987)) based on the usage of small molecular weight molecules. In the early 1990's, polymeric LEDs were invented (Burroughs et al., Nature 347, 539 (1990)). In the ensuing 15 years organic-based LED displays have been brought out into the marketplace and there has been great improvements in device lifetime, efficiency, and brightness. For example, devices containing phosphorescent emitters have external quantum efficiencies as high as 19%; whereas, device lifetimes are routinely reported at many tens of thousands of hours. However, in comparison to crystalline-based inorganic LEDs, OLEDs suffer reduced brightness, shorter lifetimes, and require expensive encapsulation for device operation.

To improve the performance of OLEDs, in the late 1990's OLED devices containing mixed emitters of organics and quantum dots were introduced (Mattoussi et al., Journal of Applied Physics 83, 7965 (1998)). Quantum dots are light-emitting nano-sized semiconductor crystals. Adding quantum dots to the emitter layers could enhance the color gamut of the device; red, green, and blue emission could be obtained by simply varying the quantum dot particle size; and the manufacturing cost could be reduced. Because of problems such as aggregation of the quantum dots in the emitter layer, the efficiency of these devices was rather low in comparison with typical OLED devices. The efficiency was even poorer when a neat film of quantum dots was used as the emitter layer (Hikmet et al., Journal of Applied Physics 93, 3509 (2003)). The poor efficiency was attributed to the insulating nature of the quantum dot layer. Later the efficiency was boosted (to ~1.5 cd/A) upon depositing a mono-layer film of quantum dots between organic hole and electron transport layers (Coe et al., Nature 420, 800 (2002)). It was stated that luminescence from the quantum dots occurred mainly as a result of Forster energy transfer from excitons on the inorganic molecules (electron-hole recombination occurs on the organic molecules). Regardless of any future improvements in efficiency, these hybrid devices still suffer from all of the drawbacks associated with pure OLED devices.

Recently, a mainly all-inorganic LED was constructed (Mueller et al., Nano Letters 5, 1039 (2005)) by sandwiching a monolayer thick core/shell CdSe/ZnS quantum dot layer between vacuum deposited inorganic n- and p-GaN layers. The resulting device had a poor external quantum efficiency of 0.001 to 0.01%. Part of that problem could be associated with the organic ligands of trioctylphosphine oxide (TOPO) and trioctylphosphine (TOP) that were reported to be present post growth. These organic ligands are insulators and would result in poor electron and hole injection onto the quantum dots. In addition, the remainder of the structure is costly to manufacture, due to the usage of electron and hole semiconducting layers grown by high-vacuum techniques, and the usage of sapphire substrates.

As described in co-pending, commonly assigned U.S. Ser. No. 11/226,622 by Kahen, which is hereby incorporated by reference in its entirety, additional semiconductor nanoparticles may be provided with the quantum dots in a layer to enhance the conductivity of the light-emitting layer.

Quantum dot light-emitting diode structures may be employed to form flat-panel displays and area illumination lamps. Likewise, colored-light or white-light lighting applications are of interest. Different materials may be employed to emit different colors and the materials may be patterned over a surface to form full-color pixels. In various embodiments, the quantum dot LEDs may be electronically or photonically stimulated and may be mixed or blended with a light-emitting organic host material for hybrid inorganic-organic LEDs.

Both inorganic and hybrid inorganic-organic light-emitting diodes (LEDs) are electroluminescent technologies that rely upon thin-film layers of materials coated upon a substrate. These technologies typically and employ a cover affixed to the substrate around the periphery of the LED device to protect the device from physical harm. The thin-film layers of materials can include, for example, organic materials, quantum dots, fused inorganic nano-particles, electrodes, conductors, and silicon electronic components as are known and taught in the LED art. The cover may include a cavity to avoid contacting the cover to the thin-film layers of materials when the cover is affixed to the substrate. Alternatively, it is known to provide a polymer layer between the thin-film layers of materials and the cover.

While quantum dots may be useful and stable light emitters, in prior-art designs the emitted light may be trapped within the light-emitting structure employed to provide current or photo-stimulation to the quantum dots. Due to the high optical indices of the materials used, many of the photons generated by the recombination process are actually trapped in the devices due to total internal reflection. These trapped photons never leave the devices and make no contribution to the light output from these devices. Because light is emitted in all directions from the light-emitting layer, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

In the prior-art example of FIG. 2, a typical LED 11 structure is shown to contain an electroluminescent (EL) unit 16 between a first electrode 14 and second electrode 18. The EL unit 16 as illustrated contains all layers between the first electrode 14 and the second electrode 18, but not the electrodes themselves. Light-emitting layer 33 contains light-emitting quantum dots 39 in a semiconductor matrix 31. Semiconductor matrix 31 can be an organic host material in the case of hybrid devices, or a polycrystalline inorganic semiconductor matrix in the case of inorganic quantum dot LEDs. EL unit 16 can optionally contain p-type or n-type charge transport layers 35 and 37, respectively, in order to improve charge injection. EL unit 16 can have additional charge transport layers, or contact layers (not shown). One typical LED device uses a glass substrate, a transparent conducting anode such as indium-tin-oxide (ITO), an EL unit 16 containing a stack of layers, and a reflective cathode layer. The layers in the EL unit can be organic, inorganic, or a combination thereof. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In typical hybrid LED devices, the refractive indices of the ITO layer, the organic semiconductor layers, and the glass are about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions. For all inorganic devices, the situation is worse due to the higher refractive index of the EL unit—typically greater than or equal to 2.0.

Referring to FIG. 3a, an LED device as taught in the prior art includes a substrate 10 on which are formed thin-film electronic components 20, for example, conductors, thin-film transistors, and capacitors in an active-matrix device or conductors in a passive-matrix device. The thin-film electronic components 20 can cover a portion of the substrate 10 or the entire substrate 10, depending on the device design. Over the substrate 10 are formed one or more first electrode(s) 14. An EL unit 16 containing one or more layers of semiconductor materials is formed over the first electrode(s) 14, at least one layer of which is light emitting. One or more second electrode(s) 18 are formed over the EL unit 16. A cover 12 with a cavity forming a gap 32 to avoid contacting the thin-film layers 14, 16, and 18 is affixed to the substrate 10. In some designs, it is proposed to fill the gap 32 with a curable polymer or resin material to provide additional rigidity. The second electrode(s) 18 may be continuous over the surface of the electroluminescent device. Upon the application of a voltage across the first and second electrodes 14 and 18, respectively provided by the thin-film electronic components 20, a current can flow through the semiconductor material layers in EL unit 16 to cause one of the semiconductor layers to emit light 50a through the cover 12 (if the cover 12 and any material in the gap 32, and the second electrode 18 are transparent) or to emit light 50b through the substrate 10 (if the substrate 10 and the first electrode 14 are transparent). The light-emitting semiconductor layer contains light-emitting quantum dots. If light is emitted through the substrate 10, it is a bottom-emitter OLED; and the thin-film electronic components 20 may occlude some of the light 50b emitted or may limit the emission area to the area 26 between the thin-film electronic components 20, thereby reducing the aperture ratio of the LED device. If light is emitted through the cover 12, the LED device is a top-emitter; and the thin-film electronic components 20 do not necessarily occlude the emitted light. The arrangement used in FIG. 2 is typically a bottom emitter configuration with a thick, highly conductive, reflective electrode 18 and suffers from a reduced aperture ratio. Referring to FIG. 3b, a top-emitter configuration can locate a first electrode 14 partially over the thin-film electronic components 20 thereby increasing the amount of light-emitting area 26. Since, in this top-emitter case, the first electrode 14 does not transmit light, it can be thick, opaque, and highly conductive. However, the second electrode must then be transparent.

For example, in the commercial practice of similar OLED devices, the substrate and cover have comprised 0.7 mm thick glass, for example, as employed in the Eastman Kodak Company LS633 digital camera. For relatively small devices, for example, less than five inches in diagonal, the use of a cavity in a cover 12 is an effective way of providing relatively rigid protection to the thin-film layers of materials 16. However, for very large devices, the substrate 10 or cover 12, even when composed of rigid materials like glass and employing materials in the gap 32, can bend slightly and cause the inside of the cover 12 or gap materials to contact or press upon the thin-film layers of materials 16, possibly damaging them and reducing the utility of the LED device.

It is known to employ spacer elements to separate thin sheets of materials. For example, U.S. Pat. No. 6,259,204, by Ebisawa et al., granted Jul. 10, 2001, describes the use of spacers to control the height of a sealing sheet above a substrate. Such an application does not, however, provide protection to thin-film layers of materials in a thin-film LED device. US 2004/0027327 entitled, "Components and methods for use in electro-optic displays" published Feb. 12, 2004, describes the use of spacer beads introduced between a backplane and a front plane laminate to prevent extrusion of a sealing material when laminating the backplane to the front plane of a flexible display. However, in this design, any thin-film layers of materials are not protected when the cover is stressed. Moreover, the sealing material will reduce the transparency of the device and requires additional manufacturing steps.

U.S. Pat. No. 6,821,828, by Ichijo et al, granted Nov. 23, 2004, describes an organic resin film, such as an acrylic resin film patterned to form columnar spacers in desired positions in order to keep two substrates apart. The gap between the substrates is filled with liquid crystal materials. Spherical spacers sprayed onto the entire surface of the substrate may replace the columnar spacers. Similarly, U.S. Pat. No. 6,559,594, granted May 6, 2003, by Fukunaga et al., describes the use of a resin spacer formed on the inside of the cover of an EL device. However, such a resin spacer may de-gas and requires expensive photolithographic processing and may interfere with the employment of color filters. Moreover, columnar spacers are formed lithographically and require complex processing steps and expensive materials. Moreover, this design is applied to liquid crystal devices and does not provide protection to thin-film structures deposited on a substrate. Additionally, rigid non-compressible spacers will transfer applied pressure directly to underlying layers, potentially damaging them.

U.S. Pat. No. 6,551,440 entitled "Method of manufacturing color electroluminescent display apparatus and method of bonding light-transmitting substrates," granted Apr. 22, 2003. In this invention, a spacer of a predetermined grain diameter is interposed between substrates to maintain a predetermined distance between the substrates. When a sealing resin, deposited between the substrates, spreads, surface tension draws the substrates together. The substrates are prevented from being in absolute contact by interposing the spacer between the substrates, so that the resin can be smoothly spread between the substrates. This design does not provide protection to thin-film structures deposited on a substrate.

The use of cured resins is also optically problematic for top-emitting LED devices. As is well known, a significant portion of the light emitted by an LED may be trapped in the LED layers, substrate, or cover. By filling the gap with a resin or polymer material, this problem may be exacerbated. Referring to FIG. 6, a prior-art bottom-emitting LED has a transparent substrate 10, a transparent first electrode 14, EL unit 16, a reflective second electrode 18, a gap 32 and an encapsulating cover 12. The encapsulating cover 12 may be opaque and may be coated directly over the second electrode 18 so that no gap 32 exists. When a gap 32 does exist, it may be filled with polymer or desiccants to add rigidity and reduce water vapor permeation into the device. Light emitted from EL unit 16 can be emitted directly out of the device, through the substrate 10, as illustrated with light ray 1. Light may also be emitted and internally guided in the substrate 10 and EL unit 16, as illustrated with light ray 2. Alternatively, light may be emitted and internally guided in EL unit 16, as illustrated with light ray 3. Light rays 4 emitted toward the reflective second electrode 18 are reflected by the reflective second electrode 18 toward the substrate 10 and then follow one of the light ray paths 1, 2, or 3.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the emissive layers; see "Modification of polymer light emission by lateral microstructure" by Safonov et al., Synthetic Metals 116, 2001, pp. 145-148, and "Bragg scattering from periodically microstructured light emitting diodes" by Lupton et al., Applied Physics Letters, Vol. 77, No. 21, Nov. 20, 2000, pp. 3340-3342. Brightness enhancement films having diffractive properties and surface and volume diffusers are described in WO/0237568, entitled "Brightness and Contrast Enhancement of Direct View Emissive Displays" by Chou et al., published May 10, 2002. The use of micro-cavity techniques is also known; for example, see "Sharply directed emission in organic electroluminescent diodes with an optical-microcavity structure" by Tsutsui et al., Applied Physics Letters 65, No. 15, Oct. 10, 1994, pp. 1868-1870. However, none of these approaches cause all, or nearly all, of the light produced to be emitted from the device. Moreover, such diffractive techniques cause a significant frequency dependence on the angle of emission so that the color of the light emitted from the device changes with the viewer's perspective.

Reflective structures surrounding a light-emitting area or pixel are referenced in U.S. Pat. No. 5,834,893, issued Nov. 10, 1998 to Bulovic et al. and describe the use of angled or slanted reflective walls at the edge of each pixel. Similarly, Forrest et al. describe pixels with slanted walls in U.S. Pat. No. 6,091,195 issued Jul. 18, 2000. These approaches use reflectors located at the edges of the light emitting areas. However, considerable light is still lost through absorption of the light as it travels laterally through the layers parallel to the substrate within a single pixel or light emitting area.

Scattering techniques are also known. Chou (WO 02/37580) and Liu et al. (U.S. Patent Application Publication No. 2001/0026124 A1) taught the use of a volume or surface scattering layer to improve light extraction. The scattering layer is applied next to the organic layers or on the outside surface of the glass substrate and has an optical index that matches these layers. Light emitted from the LED device at higher than the critical angle that would have otherwise been trapped can penetrate into the scattering layer and be scattered out of the device. The efficiency of the LED device is thereby improved but still has deficiencies as explained below.

U.S. Pat. No. 6,787,796 entitled, "Organic electroluminescent display device and method of manufacturing the same" by Do et al., issued Sep. 7, 2002, describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Patent Application Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent to the encapsulating cover is disclosed.

However, scattering techniques, by themselves, cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. For example, as illustrated in FIG. 7, a prior-art pixellated bottom-emitting LED device may include a plurality of independently controlled pixels 60, 62, 64, 66, and 68 and a scattering element 21, typically formed in a layer, located between the transparent first electrode 14 and the substrate 10. A light ray 5 emitted from the light-emitting layer may be scattered multiple times by light scattering element 21, while traveling through the substrate 10, EL unit 16, and transparent first electrode 14 before it is emitted from the device. When the light ray 5 is finally emitted from the device, the light ray 5 has traveled a considerable distance through the various device layers; from the original pixel 60 location, where it originated, to a remote pixel 68 where it is emitted, thus reducing sharpness. Most of the lateral travel occurs in the substrate 10, because that is by far the thickest layer in the package. Also, the amount of light emitted is reduced due to absorption of light in the various layers.

Light-scattering layers used externally to an OLED device are described in U.S. Patent Application Publication No. 2005/0018431 entitled, "Organic electroluminescent devices having improved light extraction" by Shiang and U.S. Pat. No. 5,955,837 entitled, "System with an active layer of a medium having light-scattering properties for flat-panel display devices" by Horikx, et al. These disclosures describe and define properties of scattering layers located on a substrate in detail. Likewise, U.S. Pat. No. 6,777,871 entitled "Organic ElectroLuminescent Devices with Enhanced Light Extraction" by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3). Moreover, if applied to display devices, this structure will decrease the perceived sharpness of the display. A device with the light-scattering layer is much less sharp than the device without the light scattering layer, although more light is extracted from an LED device with the light-scattering layer.

U.S. Patent Application Publication No. 2004/0061136 entitled, "Organic light emitting device having enhanced light extraction efficiency" by Tyan et al., describes an enhanced light extraction OLED device that includes a light scattering layer. In certain embodiments, a low-index isolation layer (having an optical index substantially lower than that of the organic electroluminescent element) is employed adjacent to a reflective layer in combination with the light scattering layer to prevent low angle light from striking the reflective layer, and thereby reduce absorption losses due to multiple reflections from the reflective layer. The particular arrangements, however, may still result in reduced sharpness of the device.

There is a need therefore for an improved LED device structure that improves the robustness of the device and reduces manufacturing costs; this solution preferably simultaneously improves device performance.

SUMMARY OF THE INVENTION

In accordance with one embodiment of the invention is directed toward an electroluminescent device comprising:
a substrate;
one or more light-emitting elements formed over the substrate, the one or more light-emitting elements including first and second spaced-apart electrodes wherein at least one of the first and second electrodes is transparent and a light-emitting layer comprising quantum dots formed between the first and second electrodes;
a cover located over the one or more light-emitting elements and spaced apart from the one or more light-emitting elements to form a gap between the cover and the one or more light-emitting elements; and separately formed spacer elements located in the gap between the cover and the one or more light-emitting elements and wherein the spacer elements are in physical contact with the one or more light-emitting elements, the cover, or both the one or more light-emitting elements and the cover.

ADVANTAGES

The present invention has the advantage that it improves the robustness and performance of quantum dot electroluminescent devices and reduces manufacturing costs.

It will be understood that the figures are not to scale since the individual layers are too thin and the thickness differences of various layers too great to permit depiction to scale.

DETAILED DESCRIPTION OF THE INVENTION

Figure 1:
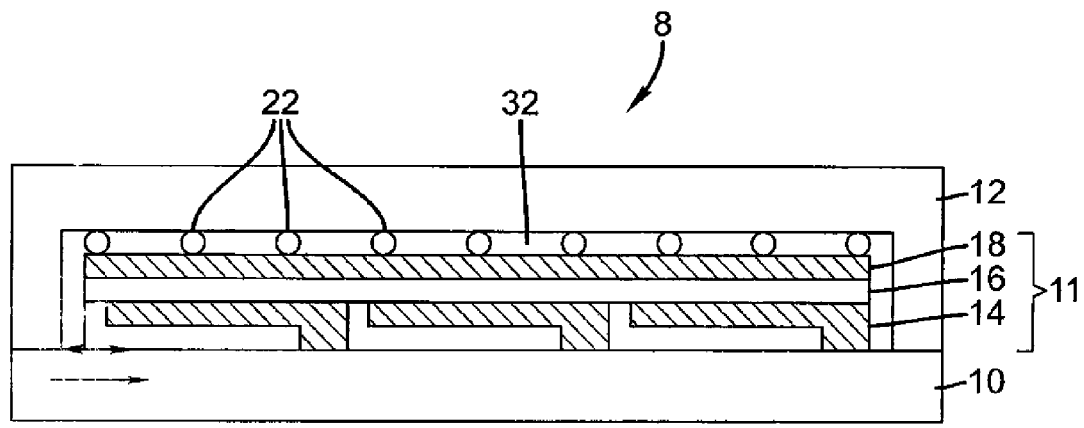
FIG. 1 is a cross section of a top-emitter electroluminescent device having spacer elements according to one embodiment of the present invention.
Figure 2:
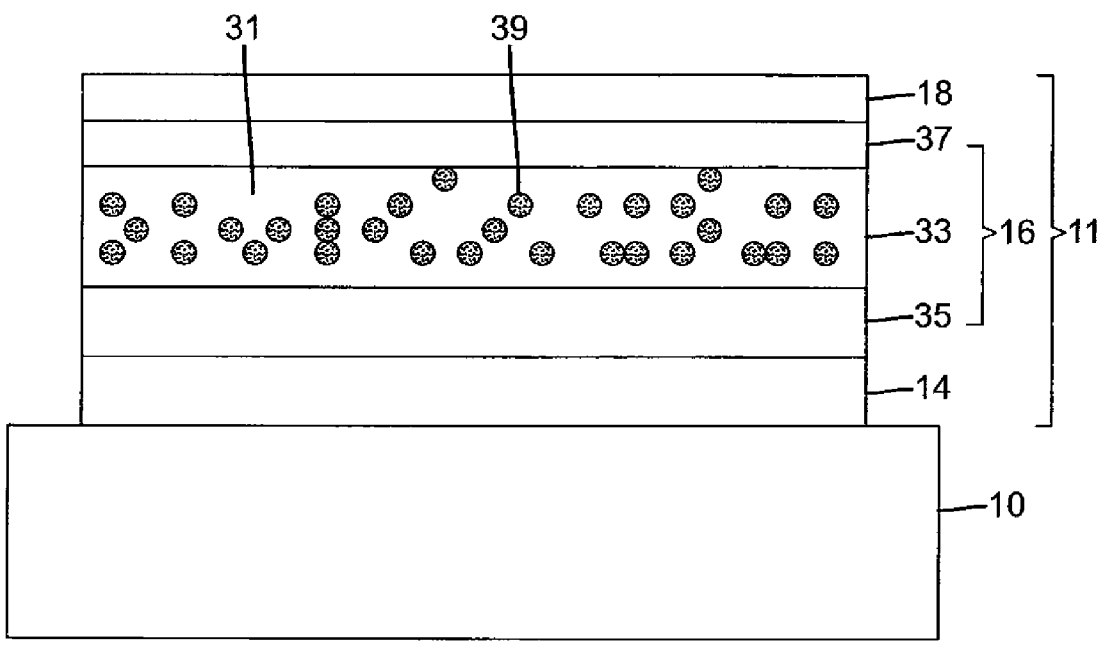
FIG. 2 is a cross section of a prior-art device.
Figure 3A:
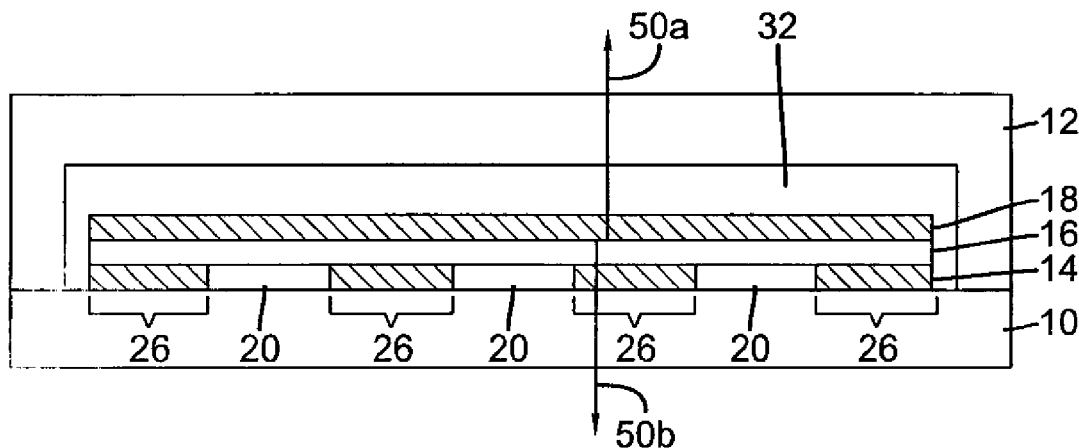
FIG. 3a is a cross section of prior art device employing a cover.
Figure 3B:
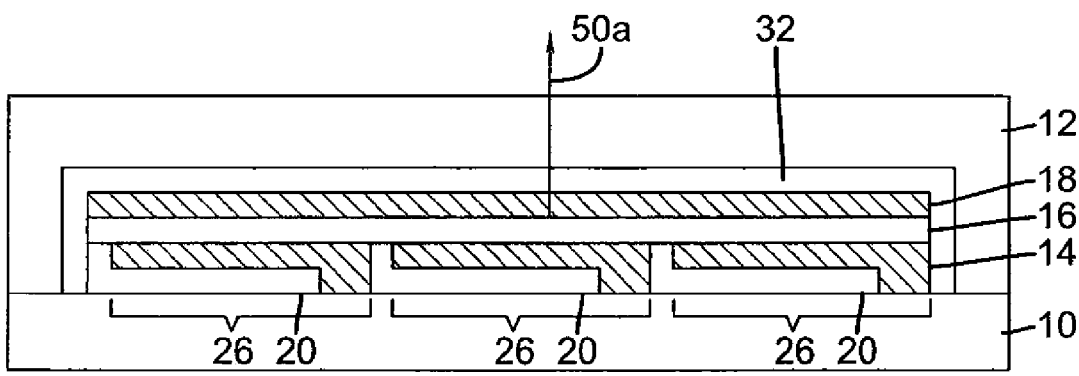
FIG. 3b is a cross section of an alternative prior art device employing a cover.

Referring to FIG. 1, in accordance with the present invention an electroluminescent (EL) device comprises a substrate 10; an LED 11 formed over the substrate 10 comprising a first electrode 14 formed over the substrate, an EL unit 16, formed over the first electrode 14, and a second electrode 18 formed over the EL unit 16; a cover 12 provided over the one or more LEDs 11 and spaced apart from the one or more LEDs 11 to form a gap 32; and separately pre-formed spacer elements 22 located in the gap between the cover 12 and the one or more LEDs 11. According to the present invention, the spacer elements 22 are non-integral with the cover 12 or substrate 10 and are separately pre-formed before they are located on the cover 12 or LED 11 in the gap 32: that is, the spacer elements 22 are not formed, for example, by lithographic materials processes used to pattern the EL unit 16, electrodes 14 and 18, or thin-film silicon materials as are found in active-matrix display devices of the prior art. In particular, the spacer elements 22 are not lithographically formed from materials used to construct or process layers on the substrate 10, for example, thin-film electronic components, passivation layers, and electrodes made of various forms of silicon (LTPS, amorphous), silicon dioxide or silicon nitride, and metals or metal oxides, or metal alloys. As employed in the present invention, the spacer elements 22 are separately pre-formed independently of the cover 12 and the LED 11 formed on the substrate 10. The spacer elements 22 are particles of material, not continuous films, used to either absorb mechanical stress applied between the cover 12 and the substrate 10 or to redirect the applied stress to areas of the LED device that are not as sensitive or easily damaged. The spacer elements 22 are not continuous films but may be deposited in a single layer. In one embodiment of the invention, the spacer elements 22 are elastic compressible spacer elements.

Figure 4:
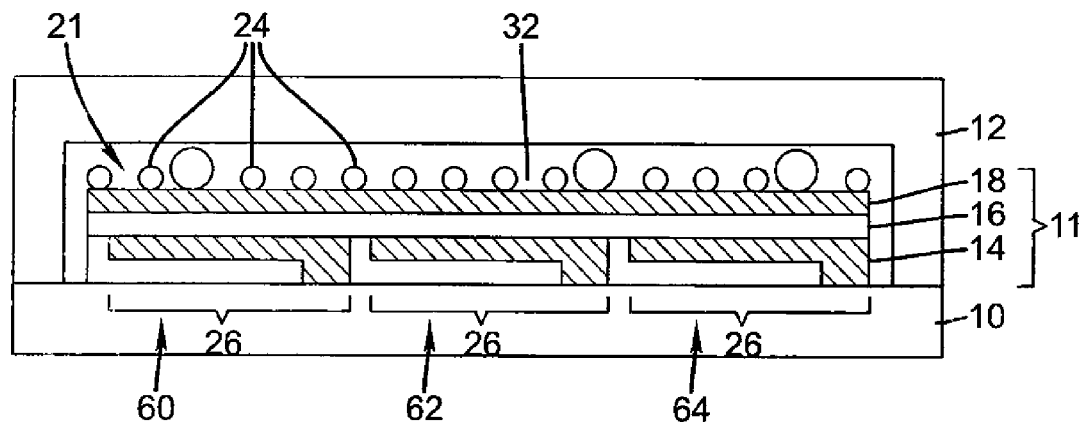
FIG. 4 is a cross section of a top-emitter LED device having spacer elements according to an alternative embodiment of the present invention.
Figure 5:
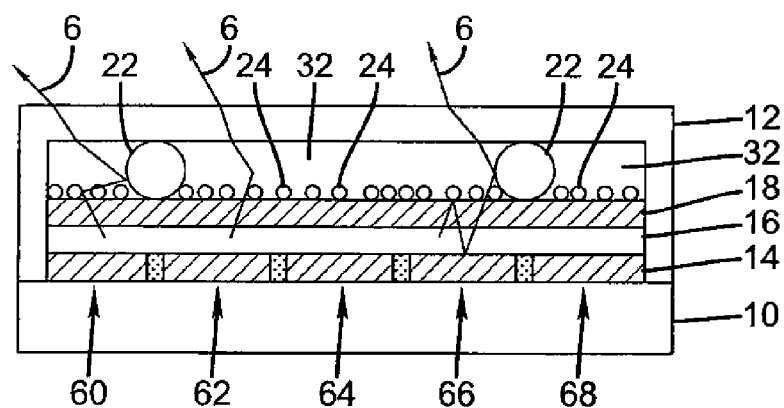
FIG. 5 is a cross section of a top-emitter LED device having spacer elements according to yet another embodiment of the present invention.
Figure 6:
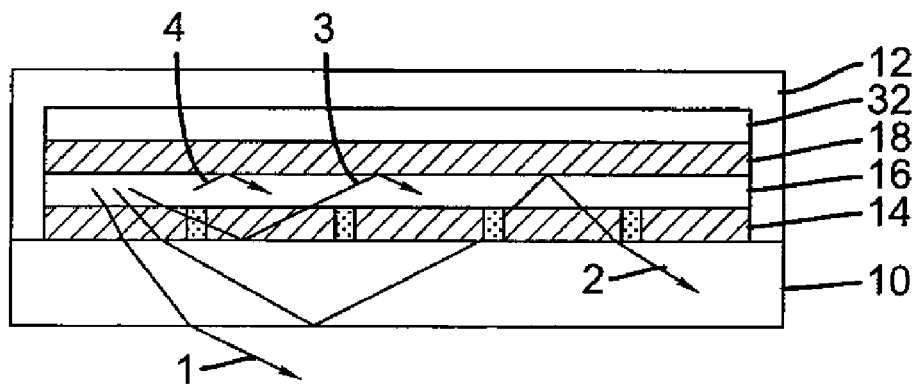
FIG. 6 is a cross section of a prior-art bottom-emitting LED device illustrating light emission.
Figure 7:
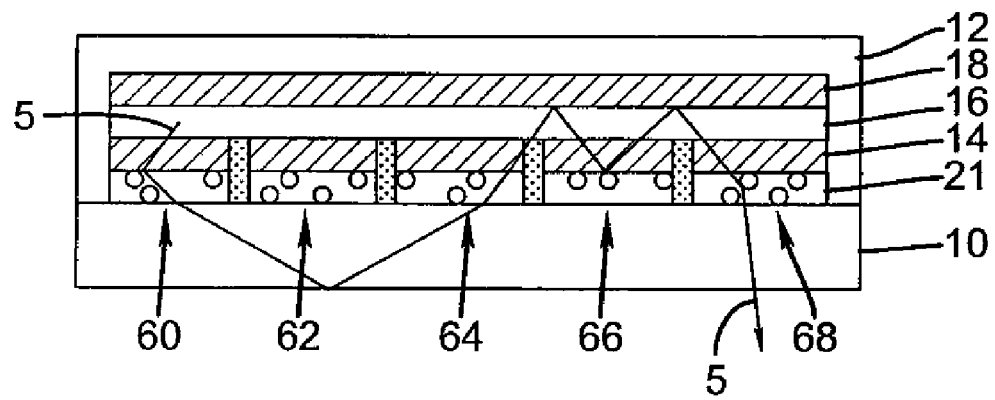
FIG. 7 is a cross section of a bottom-emitting LED device having a scattering layer as described in the prior-art illustrating light emission.
Figure 8:
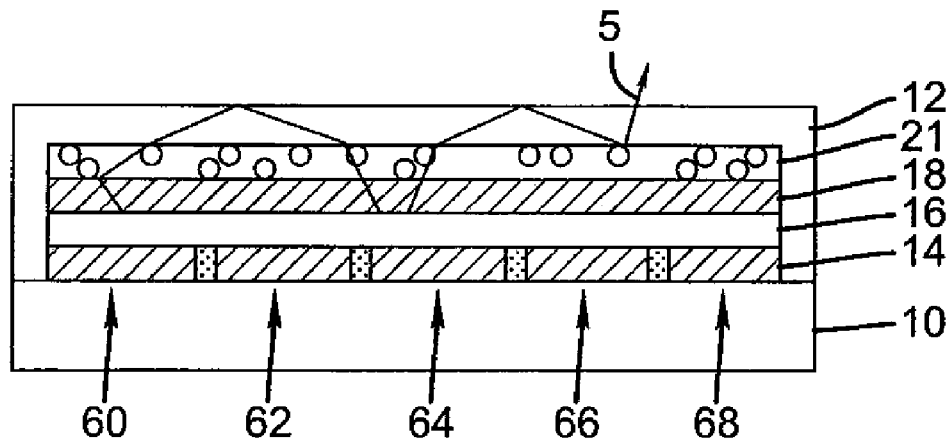
FIG. 8 is a cross section of a top-emitting LED device having a scattering layer as suggested by the prior-art illustrating light emission.

The present invention may be employed together with a scattering layer 21 located between the cover 12 and substrate 10 to scatter light that would otherwise be trapped in the electroluminescent device, in conjunction with a transparent low-index element having a refractive index lower than that of the LED and of the cover 12. FIG. 4 illustrates the combination of spacer elements and light scattering elements in accordance with the present invention. FIG. 5 illustrates the paths of light emitted from the device shown in FIG. 4. In the absence of a gap 32, the light scattering layer is alternatively placed adjacent to a transparent encapsulating cover of a top-emitting device as illustrated in FIG. 8. As shown, the light may similarly travel a significant distance in the encapsulating cover 12 before being emitted.

An inventive electroluminescent device comprises a substrate 10; an LED 11 formed over the substrate 10 comprising a first electrode 14 formed over the substrate, an EL unit 16, and a second electrode 18 as discussed above. EL unit 16 may contain multiple layers, at least one of which contains quantum dots and is light-emitting. In this embodiment, the first electrode 14 is reflective, and second electrode 18 is transparent. A transparent cover 12 provided over the LED 11 through which light from the LED is emitted. The transparent second electrode 18 and EL unit 16 have a first refractive index range; and the transparent cover 12 has a second refractive index. The separately formed spacer elements 22 have a first average size and are distributed above the transparent second electrode 18, providing spacing between the transparent second electrode 18 and the cover 12, thereby forming transparent gap 32 between the transparent second electrode and the cover. The transparent gap 32 has a third refractive index, lower than each of the first refractive index range and second refractive index. The separately formed light-scattering element particles 24 are distributed over the second electrode 18 between the spacer element particles. These light-scattering elements have a second average size smaller than the first average size of the spacer elements and scatter light emitted by the EL unit 16 during operation of the electroluminescent device.

As employed herein, light scattering particles 24 are optical particles that tend to randomly redirect any light that impinges on a layer of such particles from any direction. As used herein, a transparent electrode is one that passes some light and includes electrodes that are semi-transparent, partially reflective, or partially absorptive.

In preferred embodiments, the cover 12 and substrate 10 can comprise glass or plastic with typical refractive indices of between 1.4 and 1.6. The transparent gap 32 may comprise a solid layer of optically transparent material, a void, or a gap. Voids or gaps may be a vacuum or filled with an optically transparent gas or liquid material. For example, air, nitrogen, helium, or argon all have a refractive index of between 1.0 and 1.1 and all may be employed. Lower index solids, which may be employed, include fluorocarbon or MgF, each having indices less than 1.4. Any gas employed is preferably inert. First electrode 14 is preferably made of metal (for example, aluminum, silver, or magnesium) or metal alloys. Transparent second electrode 18 is preferably made of transparent conductive materials, for example, indium tin oxide (ITO) or other metal oxides. The EL unit 16 may be composed entirely of fused inorganic nano-particles with light-emitting quantum dots, or alternatively may use organic materials known in the art, for example, hole-injection, hole-transport, electron-injection, and/or electron-transport layers with a hybrid light-emitting layer containing quantum dots in an organic matrix. Inorganic semiconductors vary greatly in refractive index, but typically have refractive indices of greater than 2.0. Organic material layers, in the case of hybrid devices, typically have a refractive index of between 1.6 and 1.9. Indium tin oxide, a typical transparent conductor, has a refractive index of approximately 1.8-2.1. Hence, the various layers 18 and 16 in an electroluminescent device have a refractive index greater than 1.6. Of course, the refractive indices of various materials may be dependent on the wavelength of light passing through them, so the refractive index values cited here for these materials are only approximate. In any case, the transparent low-index gap 32 preferably has a refractive index at least 0.1 lower than the cover (or substrate), transparent electrode, and EL unit at the desired wavelength for the LED emitter.

According to the present invention, the first and second sizes refer to average sizes of the spacer elements 22 and the light-scattering element particles 24. In a preferred embodiment, the second size average is preferably less than 2 microns, more preferably between 100 nm and 2 microns, and most preferably between 300 nm and 1 micron. The first size is preferably from 1 to 100 microns, more preferably from 2 to 10 microns. In general, it is further preferred that the first size be at least one micron larger than the second size. Moreover, according to the present invention, the light-scattering element particles 24 have a size optimized to scatter visible light emitted by the light-emitting layer and the spacer 22 have a size optimized to prevent the cover 12 from contacting the LED 11 or light-scattering element particles 24 when the substrate 10 or cover 12 are stressed, for example by bending. It is not essential that all of the spacer element particles have the same shape or size.

Light-scattering element particles 24 may be employed in a volume scattering layer or a surface scattering layer. In certain embodiments, e.g., scattering element particles 24 may be employed in a layer having at least two different refractive indices. Such a layer may comprise, e.g., a matrix of lower refractive index and scattering element particles with a higher refractive index. Alternatively, the matrix may have a higher refractive index and the scattering element particles may have a lower refractive index. For example, the matrix may comprise silicon dioxide or cross-linked resin having indices of approximately 1.5, or silicon nitride with a much higher index of refraction.

According to the present invention, the light-scattering element particles 24 are non-integral with the cover 12 or substrate 10 and are separately formed before they are applied between the cover 12 and the LED 11 in the gap 32. As discussed above, the spacer elements 22 are also non-integral with the cover 12 or substrate 10. Similarly, the light-scattering element particles 24 are not formed, for example, by lithographic or evaporative materials processes used to make the OLED material 11, electrodes 14 and 18, or thin-film silicon components as are found in active-matrix display devices. As employed in the present invention, the spacer elements 22 and the light-scattering element particles 24 are separately formed and located in the gap 32 after the cover 12 is formed and the LED 11 is formed on the substrate 10. Likewise, the light-scattering element particles 24 may be diffusive particles, rather than a continuous film, but may be formed in a layer. Both the spacer elements 22 and the light-scattering element particles 24 may be deposited in a matrix material, for example, a polymer.

The spacer elements 22 may be rigid or flexible, and may be formed, for example, from a variety of polymers, may take a variety of shapes, for example spheres, cylinders, or have a random shape, but it is understood that the shapes are not limited thereto. Spherical shapes may have advantages in deposition, while cylinders may have optical advantages and random shapes may provide useful optical diffusion. In order to effectively space the LED 11 from the cover 12, the spacers 22 preferably have a radius or form a layer thickness of at least one micron. In order to effectively scatter visible light the optional light-scattering particles 24 preferably have a radius or form a layer thickness greater than 0.1 microns. The spacer elements 22 may comprise metals, metal alloys, metal oxides, for example, including titanium, for example titanium dioxide, indium tin oxide, or indium zinc oxide, or be formed from a variety of polymers, including electrically conductive polymers. In order to be able to absorb or redirect any stress applied to the substrate 10 and/or cover 12, the spacer elements 22 can be elastic and compressible, and are preferably are more compressible than each of the substrate and cover.

In one embodiment, the particles comprising spacer elements 22 may be located around the periphery of any light-emitting areas 26 while the light-scattering particles 24 are located over the light-emitting areas 26. In these locations, any pressure applied by the deformation of the cover 12 or substrate 10 is transmitted by the spacer elements 22 to areas between the light-emitting areas 26 and may not impact the light-emitting structures. The spacer elements 22 may additionally comprise pigments or dyes, including carbon, carbon black, pigmented inks, or dyes. The spacer elements 22 may be black or form a black matrix. The gap 32 may be filled with a low-index material having a refractive index lower than that of the OLED and of the encapsulating cover, including, e.g., an inert gas, air, nitrogen, or argon.

The spacer elements 22 may be applied to either the cover 12 or the LED 11 after the LED 11 is formed on the substrate 10 and before the cover is located over the LED 11. Once the cover 12 is formed and the LED 11 with all of its layers deposited on the substrate 10, together with any other components 20, the spacer elements 22 may be deposited on the LED 11 and the cover 12 brought into alignment with the LED 11. Alternatively, spacer elements 22 may be distributed over the inside of the cover 12; and then the spacer elements 22 and the cover 12 brought into alignment with the LED 11 and substrate 10. Protective layers (not shown) may be incorporated into LED 11 over electrode 18 to protect any environmentally sensitive layers of the LED 11.

The spacers 22 may be located over the LED 11 or cover 12 in a variety of ways. The spacer elements 22 themselves may have an adhesive coating and they may be sprayed over the surface of the LED 11 or cover 12. Likewise, the optional light-scattering particles 24 may be located over the LED 11 in a variety of ways. The light-scattering particles 24 themselves may have an adhesive coating and they may be sprayed over the surface of the LED 11. Alternatively, an adhesive may be coated on the LED 11 or cover 12 and the light-scattering particles 24 or spacer elements 22 sprayed or otherwise deposited over the adhesive coating. In such a process, the particles 22 and/or 24 are typically deposited either in a regular pattern or randomly over the coated surface but a large-scale uniform distribution of spacer elements 22 is preferred while a smaller-scale uniform distribution of light-scattering particles 24 is preferred. When distributed over the light-emitting area 26 of an OLED device, the spacer elements 22 are preferably as transparent as possible to avoid absorbing any emitted light.

In embodiments containing optional light-scattering particles 24, the spacer elements 22 and light-scattering particles 24 may be formed of the same material or of different materials. They may both be deposited on the LED 11 in a common deposition step or, alternatively, the spacer elements 22 may be deposited on the inside of the cover 12. For example, the spacer elements 22 may be applied to either the cover 12 or the LED 11 before the cover 12 is located on the LED 11 and after the LED 11 is formed on the substrate 10. Once the cover 12 is formed and the LED 11 with all of its layers deposited on the substrate, together with any electronic components, the spacer elements 22 and light-scattering particles 24 may be deposited on the LED 11 and the cover brought into proximal alignment with the LED and attached with a seal. Alternatively, the light-scattering particles 24 may be deposited on the LED 11 and the spacer elements 22 may be distributed over the inside of the cover 12 and then the spacer elements 22 and the cover 12 brought into proximal alignment with the LED 11 and substrate 10 and attached with a seal. Embodiments wherein spacer elements 22 and light-scattering particles 24 are deposited on the LED 11 in a common deposition step from a common dispersion may be employed to advantageously reduce manufacturing costs.

Figure 12B:
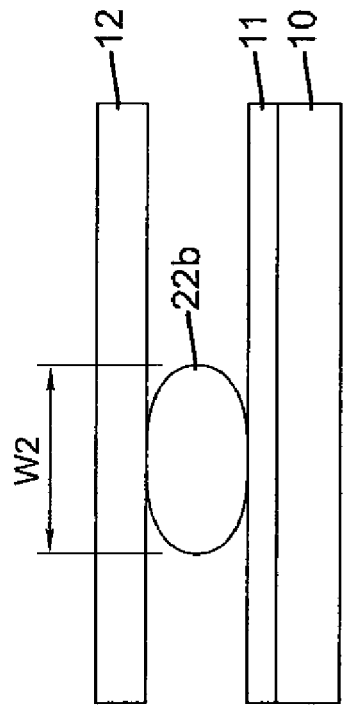
FIGS. 12a and 12b are partial cross-sections of an LED device having compressed or uncompressed spacer elements according to an embodiment of the present invention.
Figure 12A:
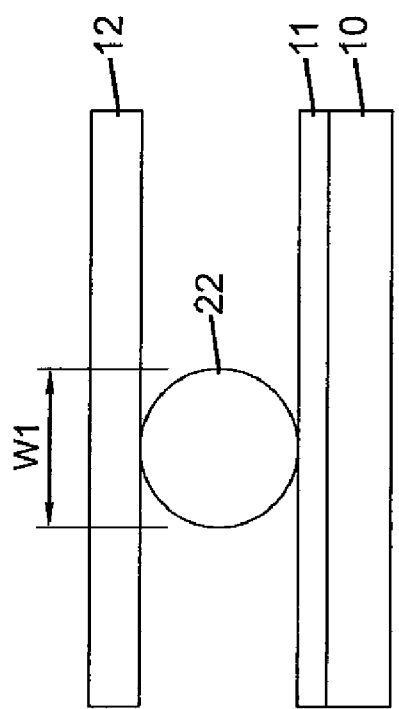

In one embodiment of the invention, spacer elements 22 are elastic compressible spacer dots that may change shape when compressed, thereby increasing the contact area with the compressing surface. When the stress is removed, the spacer element 22 returns to its former shape. According to the present invention, the spacer element 22 may not completely return to its former shape, but does so substantially, so that repeated stress may cause compression until the elastic compressible spacer element 22 fails. Referring to FIG. 12a, an elastic compressible spacer element particle 22 in an uncompressed state has a contact area W1 with the cover 12 and LED 11. As shown in FIG. 12b, an elastic compressible spacer element particle 22b in a compressed state has a contact area W2 with the cover 12 and LED 11. Because the compressed state contact area W2 is larger than the uncompressed state contact area W1, the pressure on the LED 11 and cover 12 is smaller and the potential damage done to the LED 11 is reduced. If a spacer element 22 is not elastic compressible, the spacer element 22 would not change shape due to stress, and the pressure applied to the LED 11 would be larger and more likely to cause damage.

Figure 9:
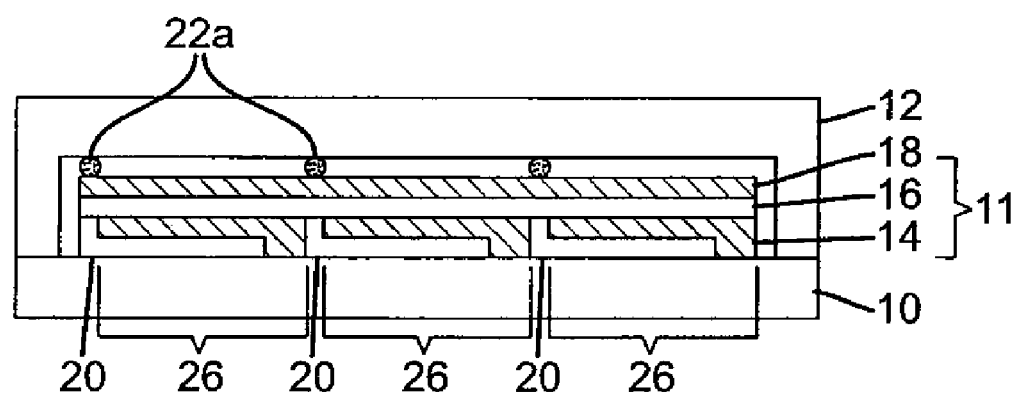
FIG. 9 is a cross section of a top-emitter LED device having spacer elements according to an alternative embodiment of the present invention.
Figure 11:
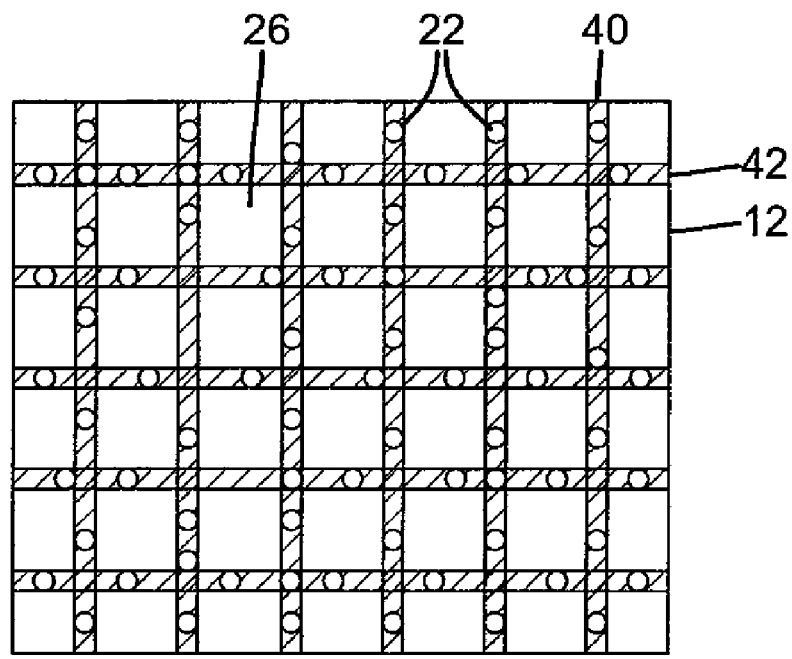
FIG. 11 is a top view of an LED device having spacer elements distributed between light-emitting areas according to another embodiment of the present invention.

Referring to FIG. 9, in an alternative embodiment of the present invention, an adhesive may be patterned over the surface of the LED 11 or cover 12 between light-emitting areas 26 of the OLED device. In this embodiment, the subsequently adhered spacer elements 22 will also be located between the light-emitting areas 26 of the LED device so that any light emitted by the LED 11 will not encounter the elastic compressible spacer elements and thereby experience any undesired optical effect. In this case, the illustrated spacer elements 22 may be black and light absorbing, since no light is emitted from the areas in which the spacer elements 22 are deposited and a black spacer element 22 can then absorb stray or ambient light, thereby increasing the sharpness and ambient contrast of the OLED device. In another embodiment, the spacer elements 22 may be located either around every light emitting area or in areas between some of the light-emitting areas, for example, in rows 42 or columns 40, between pixel groups as is shown in FIG. 11.

In a preferred embodiment, the spacer elements are located around the periphery of any light-emitting areas. In one embodiment illustrated in FIG. 11, the space elements 22 are located in columns between light-emitting areas 40 and rows between light-emitting areas 42. In these locations, any pressure applied by the deformation of the cover 12 or substrate 10 is transmitted to the elastic compressible spacer elements 22 at the periphery of the light-emitting areas, thereby reducing the stress on the light-emitting materials. Although light-emitting materials may be coated over the entire LED device, stressing or damaging them between the light-emitting areas (without creating an electrical short) may not have a deleterious effect on the LED device. If, for example, the top electrode 18 is damaged, there may not be any significant damage to the device nor any change in light emission from the light-emitting areas. Moreover, in a top-emitter configuration, the periphery of the LED light-emitting areas 26 may be taken up by thin-film silicon materials that are more resistant to stress.

In one embodiment of the invention, the elastic compressible spacer elements 22 may be hemisphere-shaped. A hemisphere provides a precision gap as well as high light transmission. A hemisphere also provides excellent compression and fatigue characteristics. In another embodiment of the invention, the elastic compressible spacer elements 22 may be cylinder-shaped having rectangular or circular cross sections. A rectangular elastic compressible spacer element 22 (for example, a cube) provides impact resistance as well as a precision optical spacing. In another embodiment, the elastic compressible spacer elements 22 may be pyramid-shaped, which may have a flat top. A pyramid provides a precision optical gap as well as some light directing. A 45-degree pyramid in air will tend to focus transmitted light into a line perpendicular to the base of the pyramid providing both optical spacing as well as light directing. Further, the pyramid and hemisphere shapes provide a more rapidly changing compression gradient as the shape is compressed.

Materials of elastic compressible spacer elements 22 can include organic materials (for example, polymers or electrically conductive polymers) or inorganic materials. The elastic compressible spacer elements 22 are preferably constructed from a polymer. A transparent polymeric material may provide high light transmission properties, is inexpensive and may easily be formed into elastic compressible spacer elements 22. Suitable polymer materials include polyolefins, polyesters, polyamides, polycarbonates, cellulosic esters, polystyrene, polyvinyl resins, polysulfonamides, polyethers, polyimides, polyvinylidene fluoride, polyurethanes, polyphenylenesulfides, polytetrafluoroethylene, polyacetals, polysulfonates, polyester ionomers, and polyolefin ionomers. Polycarbonate polymers have high light transmission and strength properties. Copolymers and/or mixtures of these polymers can be used. Polyolefins particularly polypropylene, polyethylene, polymethylpentene, and mixtures thereof are suitable. Polyolefin copolymers, including copolymers of propylene and ethylene such as hexene, butene and octene can also be used. Polyolefin polymers are suitable because they are low in cost and have good strength and surface properties and have been shown to be soft and scratch resistant.

When located in light-emitting areas 26, the polymeric materials used to make the elastic compressible spacer elements 22 of this invention preferably have a light transmission greater than 92%. A polymeric material having an elastic modulus greater than 500 MPa is suitable. An elastic modulus greater than 500 MPa allows the elastic compressible spacer elements 22 to withstand the compressive forces to which display screens may be subject. Further, an elastic modulus greater than 500 MPa allows for efficient assembly of a display, as the elastic compressible spacer elements 22 are tough and scratch resistant.

If deposited over the light-emitting areas, the elastic compressible spacer elements 22 may also serve as light scattering elements and be employed to enhance light. Such light scattering may have advantages in extracting light from the OLED by reducing the amount of light that is waveguided in the EL unit 16 and electrodes 18 and 14, if they are partially transparent. To enhance the scattering and light extraction effect, the elastic compressible spacer elements 22 may have a refractive index greater than the refractive index of any component of the LED and/or any materials in the gap 32 have a refractive index lower than the refractive index of any component of the LED. The spacer elements may be sprayed on or deposited using inkjet techniques. Various coating techniques, for example, spin or curtain coating, may also be employed.

Figure 10:
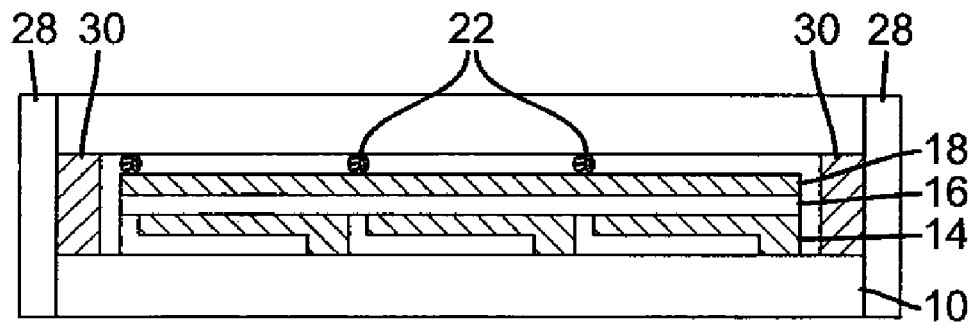
FIG. 10 is a cross section of a top-emitter LED device having spacer elements and an end cap according to yet another embodiment of the present invention.
Figure 13A:
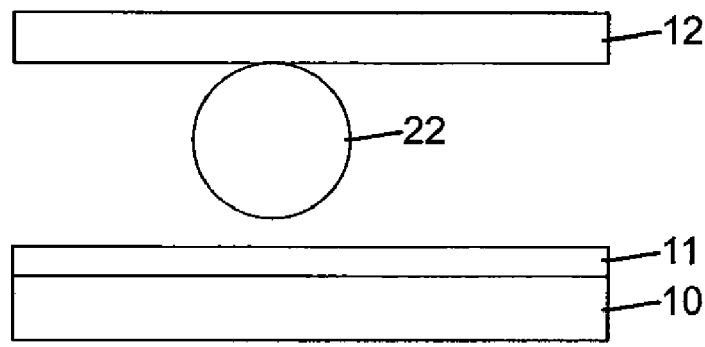
FIGS. 13a, 13b, and 13c are partial cross-sections of an LED device having spacer elements located in different positions according to various embodiments of the present invention.
Figure 13B:
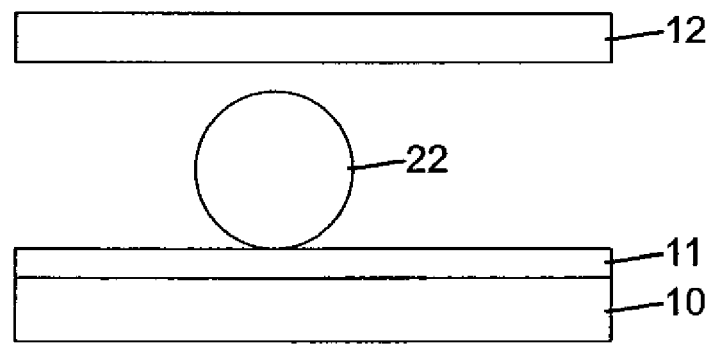
Figure 13C:
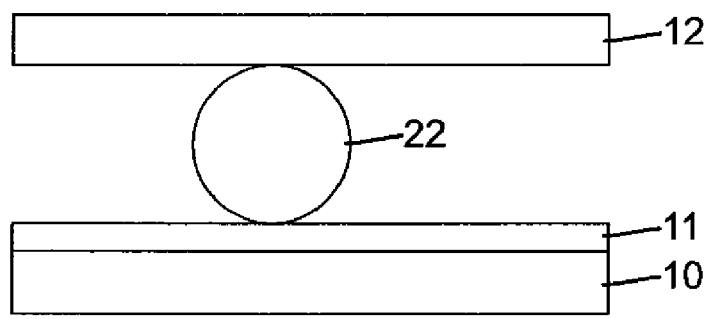

The cover 12 may or may not have a cavity. If the cover 12 does have a cavity, the cavity may be deep enough to contain the spacer elements 22 so that the periphery of the cover 12 may be affixed to the substrate 10, as shown in FIG. 1. The spacer elements 22 may be in contact with only the inside of the cover 12 (if applied to the cover) as shown in FIG. 13a, or be in contact with only the LED 11 (if applied to LED 11) as shown in FIG. 13b, or to both LED 11 and the inside of the cover 12 as shown in FIG. 13c. If the spacer elements 22 are in contact with both the LED 11 and the inside of the cover 12 and the cover 12 is affixed to the substrate 10, the cavity in the cover 12 should have a depth approximately equal to the thickness of the spacer elements 22. Alternatively, referring to FIG. 10, the cover may not have a cavity. In this case, a sealant 30 can optionally be employed to defeat the ingress of moisture into the LED device. Providing adequate sealing is especially important to inorganic-organic hybrid devices that suffer from many of the same environmental sensitivities as OLED devices. An additional end-cap 28 as shown in FIG. 10 may be affixed to the edges of the cover 12 and substrate 10 to further defeat the ingress of moisture or other environmental contaminants into the LED device.

Materials of the light-scattering particles 24 and the spacer elements 22 can include organic materials (for example, polymers or electrically conductive polymers) or inorganic materials. The organic materials may include, e.g., one or more of polythiophene, PEDOT, PET, or PEN. The inorganic materials may include, e.g., one or more of $SiO_x(x>1)$, $SiN_x$ $(x>1)$, $Si_3N_4$, $TiO_2$, $MgO$, $ZnO$, $Al_2O_3$, $SnO_2$, $In_2O_3$, $MgF_2$, $Al_2O_3$ and $CaF_2$.

Spacer elements 22 and light-scattering particles 24 may be coated from a liquid dispersion, for example, polymer having a dispersion of titanium dioxide. The spacer elements 22 and light-scattering particles 24 may be deposited using a variety of known techniques, for example, they may be sprayed on, deposited using inkjet techniques, or spin- or curtain-coated. The spacer elements 22 and light-scattering particles 24 may be deposited directly onto an LED stack, for example, onto an electrode, or may be deposited on a protective layer formed on an LED, for example, over a coating of parylene or aluminum oxide formed over an LED electrode.

According to one embodiment of the present invention, an electroluminescent device 8 employing elastic compressible spacer elements 22, located in a gap 32 between a cover 12 and an LED 11, is more robust in the presence of stress between the cover 12 and the substrate 10. In a typical situation, the cover 12 is deformed either by bending the entire EL device 8 or by separately deforming the cover 12 or substrate 10, for example, by pushing on the cover 12 or substrate 10 with a finger or hand or by striking the cover 12 or substrate 10 with an implement such as a ball. When this occurs, the substrate 10 or cover 12 will deform slightly putting pressure on the elastic compressible spacer elements 22. Since the elastic compressible spacer elements 22 are more compressible than each of the substrate 10 and cover 12 and less compressible than other material within the gap 32, the elastic compressible spacer elements 22 will preferably absorb the pressure, preventing the cover 12 or other material within the gap from pressing upon the LED 11.

In one embodiment employing optional light-scattering particles 24, an LED device with light-scattering particles 24 over the light-emitting areas 26 and spacer elements 22 located between a cover 12 and a LED 11 in a gap, emits more light and is more robust in the presence of stress between the cover 12 and the substrate 10. In a typical situation, the cover 12 is deformed either by bending the entire EL device 8 or by separately deforming the cover 12 or substrate 10, as described above. When this occurs, the substrate 12 or cover 10 will deform slightly, putting pressure on the spacer elements 22. Since the spacer elements 22 are thicker than the light-scattering particles 24, the spacer elements 22 will preferably absorb the pressure, preventing the cover 12 or material within the gap 32 from pressing upon the LED 11 or the light-scattering particles 24 and destroying the function of the LED 11 or the light-scattering particles 24. The use of spacer elements 22 that are compressible is also be advantageous in this case since that, under compression, the spacer elements 22 may increase the surface area in contact with the LED 11, and thereby decrease the pressure applied to the layers.

One or more additional protective layers may be applied to the top electrode 18 to provide environmental and mechanical protection. For example, a layer of ITO, parylene, or a plurality of layers of $Al_2O_3$ may be coated over the electrode 18 to provide a hermetic seal and may also provide useful optical properties to the electrode 18.

The elastic compressible spacer elements 22 may have a thickness of between 10 nm and 100 microns, more preferably between 100 nm and 10 microns. It is not essential that all of the spacer elements 22 have the same shape or size.

Most hybrid inorganic-organic devices are sensitive to moisture or oxygen, or both, so they are commonly sealed in an inert atmosphere such as nitrogen or argon, along with a moisture-absorbing desiccant such as alumina, bauxite, calcium sulfate, clays, silica gel, zeolites, barium oxide, alkaline metal oxides, alkaline earth metal oxides, sulfates, or metal halides and perchlorates. The spacer elements may have desiccating properties and may include one or more of the desiccant materials. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

In order to maintain a robust and tight seal around the periphery of the substrate 10 and cover 12, and to avoid possible motion of the cover 12 with respect to the substrate 10, and possibly damaging the electrodes and organic materials of the LED, it is possible to adhere the cover 12 to the substrate 10 in an environment that has a pressure of less than one atmosphere. If the gap 32 is filled with a relatively lower-pressure gas (for example, air, nitrogen, or argon), this will provide pressure between the cover 12 and substrate 10 to help prevent motion between the cover 12 and substrate 10, thereby creating a more robust component.

Electroluminescent devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover 12 or as part of the cover 12.

The present invention may also be practiced with either active- or passive-matrix electroluminescent devices. It may also be employed in display devices or in area illumination devices. In one embodiment, the present invention is employed in a flat-panel electroluminescent device composed of fused inorganic nanoparticles, as disclosed in, but not limited to US Patent Application Publication No. US2007/0057263 and U.S. application Ser. No. 11/683,479 by Kahen. Many combinations and variations of core/shell quantum dot light-emitting displays can be used to fabricate such a device, including both active- and passive-matrix displays having either a top- or bottom-emitter architecture.

Figure 14:
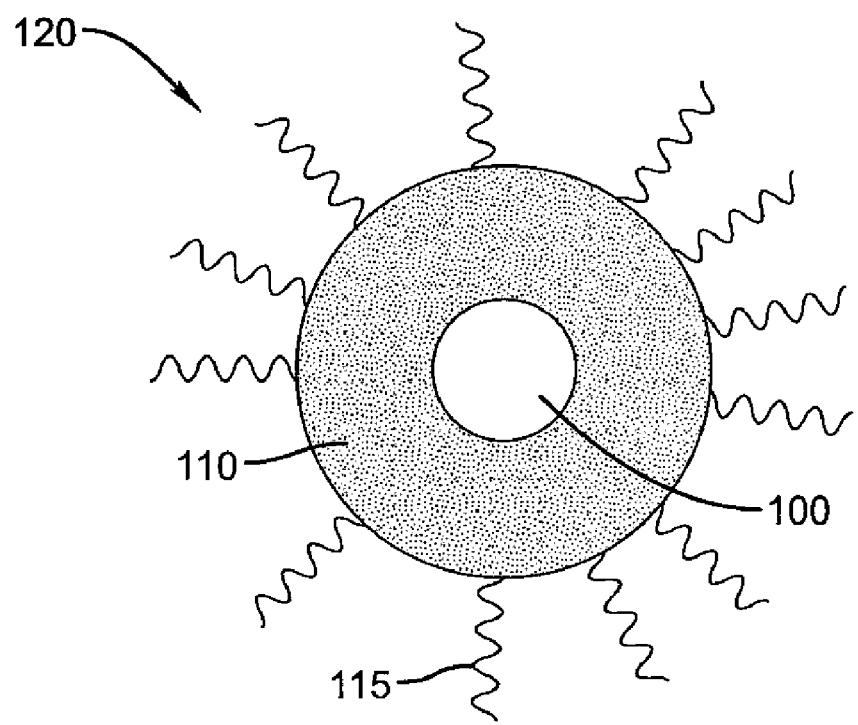
FIG. 14 shows a schematic of a light emitting core/shell quantum dot.
Figure 15:
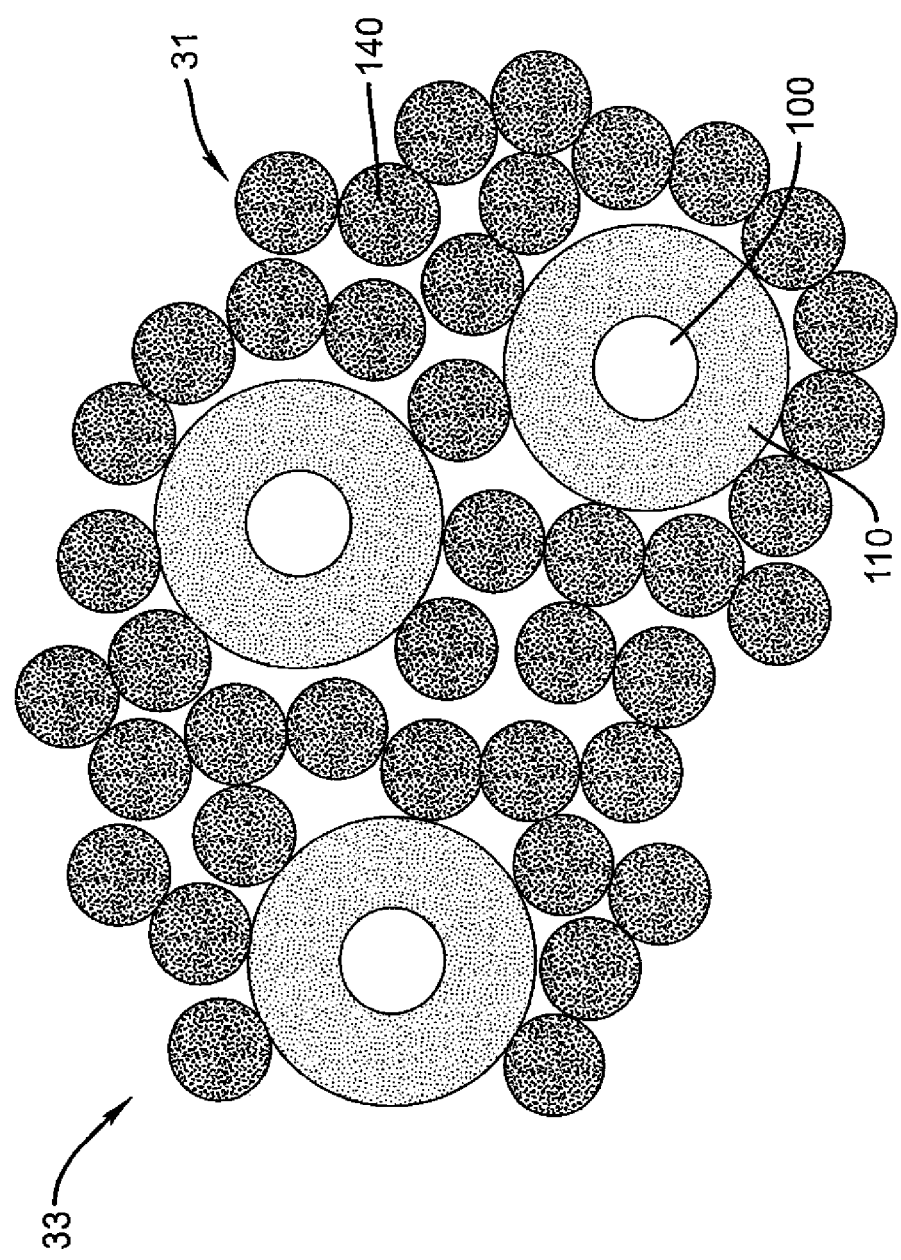
FIG. 15 shows a schematic of a section of a polycrystalline inorganic light-emitting layer in accordance with the invention.

Referring to FIGS. 14 and 15, for one embodiment of the present invention, the light-emissive particles 39 are quantum dots 120. Using quantum dots 120 as the emitters in light-emitting diodes confers the advantage that the emission wavelength can be simply tuned by varying the size of the quantum dot particle. As such, spectrally narrow (resulting in a larger color gamut), multi-color emission can occur. If the quantum dots 120 are prepared by colloidal methods [and not grown by high vacuum deposition techniques (S. Nakamura et al., Electronics Letter 34, 2435 (1998))], then the substrate no longer needs to be expensive or lattice matched to the LED semiconductor system. For example, the substrate could be glass, plastic, metal foil, or Si. Forming quantum dot LEDs using these techniques is highly desirably, especially if low cost deposition techniques are used to deposit the LED layers.

A schematic of a core/shell quantum dot 120 emitter is shown in FIG. 14. The particle contains a light-emitting core 100, a semiconductor shell 110, and organic ligands 115. Since the size of typical quantum dots 120 is on the order of a few nanometers and commensurate with that of its intrinsic exciton, both the absorption and emission peaks of the particle are blue-shifted relative to bulk values (R. Rossetti et al., Journal of Chemical Physics 79, 1086 (1983)). As a result of the small size of the quantum dots, the surface electronic states of the dots have a large impact on the dot's fluorescence quantum yield. The electronic surface states of the light-emitting core 100 can be passivated either by attaching appropriate (e.g., primary amines) organic ligands 115 to its surface or by epitaxially growing another semiconductor (the semiconductor shell 110) around the light-emitting core 100. The advantages of growing the semiconductor shell 110 (relative to organically passivated cores) are that both the hole and electron core particle surface states can be simultaneously passivated, the resulting quantum yields are typically higher, and the quantum dots are more photostable and chemically robust. Because of the limited thickness of the semiconductor shell 110 (typically 1-2 monolayers), its electronic surface states also need to be passivated. Again, organic ligands 115 are the common choice. Taking the example of a CdSe/ZnS core/shell quantum dot 120, the valence and conduction band offsets at the core/shell interface are such that the resulting potentials act to confine both the holes and electrons to the core region. Since the electrons are typically lighter than the heavy holes, the holes are largely confined to the cores, while the electrons penetrate into the shell and sample its electronic surface states associated with the metal atoms (R. Xie et al., Journal of the American Chemical Society, 127, 7480 (2005)). Accordingly, for the case of CdSe/ZnS core/shell quantum dots 120, only the shell's electron surface states need to be passivated; an example of a suitable organic ligand 115 would be one of the primary amines which forms a donor/acceptor bond to the surface Zn atoms (X. Peng et al., Journal of the American Chemical Society, 119, 7019 (1997)). In summary, typical highly luminescent quantum dots have a core/shell structure (higher bandgap surrounding a lower band gap) and have non-conductive organic ligands 115 attached to the shell's surface.

Colloidal dispersions of highly luminescent core/shell quantum dots have been fabricated by many workers over the past decade (O. Masala and R. Seshadri, Annual Review of Materials Research 34, 41 (2004)). The light-emitting core 100 is composed of type IV (Si), III-V (InAs), or II-VI (CdTe) semiconductive material. For emission in the visible part of the spectrum, CdSe is a preferred core material since by varying the diameter (1.9 to 6.7 nm) of the CdSe core; the emission wavelength can be tuned from 465 to 640 nm. As is well known in the art, visible emitting quantum dots can be fabricated from other material systems, such as, doped ZnS (A. A. Bol et al., Phys. Stat. Sol. B224, 291 (2001)). The light-emitting cores 100 are made by chemical methods well known in the art. Typical synthetic routes are decomposition of molecular precursors at high temperatures in coordinating solvents, solvothermal methods (disclosed by O. Masala and R. Seshadri, Annual Review of Materials Research, 34, 41 (2004)), and arrested precipitation (disclosed by R. Rossetti et al., Journal of Chemical Physics, 80, 4464 (1984)). The semiconductor shell 110 is typically composed of type II-VI semiconductive material, such as, CdS or ZnSe. The shell semiconductor is typically chosen to be nearly lattice matched to the core material and have valence and conduction band levels such that the core holes and electrons are largely confined to the core region of the quantum dot. Preferred shell material for CdSe cores is $ZnSe_xS_{1-x}$, with x varying from 0.0 to ~0.5. Formation of the semiconductor shell 110 surrounding the light emitting core 100 is typically accomplished via the decomposition of molecular precursors at high temperatures in coordinating solvents (M. A. Hines et al., Journal of Physical Chemistry, 100, 468 (1996)) or reverse micelle techniques (A. R. Kortan et al., Journal of the American Chemical Society, 112, 1327 (1990)).

As is well known in the art, low-cost ways for forming quantum dot films can include depositing the colloidal dispersion of core/shell quantum dots 120 by drop casting and spin casting; alternatively, spray deposition may be employed. Common solvents for drop casting quantum dots are a 9:1 mixture of hexane:octane (C. B. Murray et al., Annual Review of Materials Science, 30, 545 (2000)). The organic ligands 115 need to be chosen such that the quantum dot particles are soluble in hexane. As such, organic ligands 115 with hydrocarbon-based tails are good choices, such as, the alkylamines. Using well-known procedures in the art, the ligands coming from the growth procedure (TOPO, for example) can be exchanged for the organic ligand 115 of choice (C. B. Murray et al., Annual Review of Materials Science, 30, 545 (2000)). When depositing a colloidal dispersion of quantum dots 120, the requirements of the solvent are that it easily spreads on the deposition surface and the solvents evaporate at a moderate rate during the deposition process. It was found that alcohol-based solvents are a good choice; for example, combining a low boiling point alcohol, such as, ethanol, with higher boiling point alcohols, such as, a butanol-hexanol mixture, results in good film formation. Correspondingly, ligand exchange can be used to attach an organic ligand 115 (to the quantum dots) whose tail is soluble in polar solvents; pyridine is an example of a suitable ligand. The quantum dot films resulting from these two deposition processes are luminescent, but non-conductive. The films are resistive, since non-conductive organic ligands separate the core/shell quantum dot 120 particles. The films are also resistive since as mobile charges propagate along the quantum dots, the mobile charges get trapped in the core regions due to the confining potential barrier of the semiconductor shell 110.

Proper operation of inorganic LEDs typically requires low-resistivity n-type and p-type transport layers, surrounding a conductive (nominally doped) and luminescent emitter layer. As discussed above, typical quantum dot films are luminescent, but insulating. FIG. 15 schematically illustrates a way of providing an inorganic light-emitting layer 33 that is simultaneously luminescent and conductive. The concept is based on co-depositing small (<2 nm), conductive inorganic nanoparticles 140 along with the core/shell quantum dots 120 to form the inorganic light-emitting layer 33. A subsequent inert gas (Ar or $N_2$) anneal step is used to sinter the smaller inorganic nanoparticles 140 amongst themselves and onto the surface of the larger core/shell quantum dots 120. Sintering the inorganic nanoparticles 140, results in fusing the semiconductor nanoparticles into a polycrystalline matrix 130 useful in layer 33 as semiconductor matrix 31. Through the sintering process, the polycrystalline matrix 130 is also connected to the core/shell quantum dots 120. As such, a conductive path is created from the edges of the inorganic light-emitting layer 33, through the semiconductor matrix 130 and to each core/shell quantum dot 120, where electrons and holes recombine in the light emitting cores 100. It should also be noted that encasing the core/shell quantum dots 120 in the conductive polycrystalline semiconductor matrix 130 has the added benefit that it protects the quantum dots 120 environmentally from the effects of both oxygen and moisture.

The inorganic nanoparticles 140 can be composed of conductive semiconductor material, such as, type IV (Si), III-V (GaP), or II-VI (ZnS or ZnSe) semiconductors. In order to easily inject charge into the core/shell quantum dots 120, it is preferred that the inorganic nanoparticles 140 be composed of a semiconductor material with a band gap comparable to that of the semiconductor shell 110 material, more specifically a band gap within 0.2 eV of the shell material's band gap. For the case that ZnS is the outer shell of the core/shell quantum dots 120, then the inorganic nanoparticles 140 are composed of ZnS or ZnSSe with a low Se content. The inorganic nanoparticles 140 are made by chemical methods well known in the art. Typical synthetic routes are decomposition of molecular precursors at high temperatures in coordinating solvents, solvothermal methods (O. Masala and R. Seshadri, Annual Review of Materials Research, 34, 41 (2004)), and arrested precipitation (R. Rossetti et al., Journal of Chemical Physics, 80, 4464 (1984)). As is well known in the art, nanometer-sized nanoparticles melt at a much-reduced temperature relative to their bulk counterparts (A. N. Goldstein et al., Science 256, 1425 (1992)). Correspondingly, it is desirable that the inorganic nanoparticles 140 have diameters less than 2 nm in order to enhance the sintering process, with a preferred size of 1-1.5 nm. With respect to the larger core/shell quantum dots 120 with ZnS shells, it has been reported that 2.8 nm ZnS particles are relatively stable for anneal temperatures up to 350° C. (S. B. Qadri et al., Physical Review B60, 9191 (1999)). Combining these two results, the anneal process has a preferred temperature between 250 and 300° C. and a duration up to 60 minutes, which sinters the smaller inorganic nanoparticles 140 amongst themselves and onto the surface of the larger core/shell quantum dots 120, whereas the larger core/shell quantum dots 120 remain relatively stable in shape and size.

To form an inorganic polycrystalline light-emitting layer 33, a co-dispersion of inorganic nanoparticles 140 and core/shell quantum dots 120 may be formed. Since it is desirable that the core/shell quantum dots 120 be surrounded by the inorganic nanoparticles 140 in the inorganic polycrystalline light-emitting layer 33, the ratio of inorganic nanoparticles 140 to core/shell quantum dots 120 is chosen to be greater than 1:1. A preferred ratio is 2:1 or 3:1. Depending on the deposition process, such as, spin casting or drop casting, an appropriate choice of organic ligands 115 is made. Typically, the same organic ligands 115 are used for both types of particles. In order to enhance the conductivity (and electron-hole injection process) of the inorganic light emitting layer 33, it is preferred that the organic ligands 115 attached to both the core/shell quantum dots 120 and the inorganic nanoparticles 140 evaporate as a result of annealing the inorganic light emitting layer 33 in an inert atmosphere. By choosing the organic ligands 115 to have a low boiling point, they can be made to evaporate from the film during the annealing process (C. B. Murray et al., Annual Review of Material Science 30, 545 (2000)). Consequently, for films formed by drop casting, shorter chained primary amines, such as, hexylamine are preferred; for films formed by spin casting, pyridine is a preferred ligand. Annealing thin films at elevated temperatures can result in cracking of the films due to thermal expansion mismatches between the film and the substrate. To avoid this problem, it is preferred that the anneal temperature be ramped from 25° C. to the anneal temperature and from the anneal temperature back down to room temperature. A preferred ramp time is on the order of 30 minutes. The thickness of the resulting inorganic light-emitting layer 33 should be between 10 and 100 nm.

Following the anneal step, the core/shell quantum dots 120 would be devoid of organic ligands 115. For the case of CdSe/ZnS quantum dots, having no outer ligand shell would result in a loss of free electrons due to trapping by the shell's unpassivated surface states (R. Xie, Journal of American Chemical Society 127, 7480 (2005)). Consequently, the annealed core/shell quantum dots 120 would show a reduced quantum yield compared to the unannealed dots. To avoid this situation, the ZnS shell thickness needs to be increased to such an extent whereby the core/shell quantum dot electron wavefunction no longer samples the shell's surface states. Using calculational techniques well known in the art (S. A. Ivanov et al., Journal of Physical Chemistry 108, 10625 (2004)), the thickness of the ZnS shell needs to be at least 5 monolayers (ML) thick in order to negate the influence of the electron surface states. However, up to a 2 mL thick shell of ZnS can be directly grown on CdSe without the generation of defects due to the lattice mismatch between the two semiconductor lattices (D. V. Talapin et al., Journal of Physical Chemistry 108, 18826 (2004)). To avoid the lattice defects, an intermediate shell of ZnSe can be grown between the CdSe core and the ZnS outer shell. This approach was taken by Talapin et al. (D. V. Talapin et al., Journal of Physical Chemistry, B108, 18826 (2004)), where they were able to grow up to an 8 mL thick shell of ZnS on a CdSe core, with an optimum ZnSe shell thickness of 1.5 mL. More sophisticated approaches can also be taken to minimize the lattice mismatch difference, for instance, smoothly varying the semiconductor content of the intermediate shell from CdSe to ZnS over the distance of a number of monolayers (R. Xie et al., Journal of the American Chemical Society, 127, 7480 (2005)). In sum the thickness of the outer shell is made sufficiently thick so that neither free carrier samples the electronic surface states. Additionally, if necessary, intermediate shells of appropriate semiconductor content are added to the quantum dot in order to avoid the generation of defects associated with thick semiconductor shells 110.

As a result of surface plasmon effects (K. B. Kahen, Applied Physics Letter 78, 1649 (2001)), having metal layers adjacent to emitter layers results in a loss in emitter efficiency. Consequently, it is advantageous to space the emitters' layers from any metal contacts by sufficiently thick (at least 150 nm) charge transport layers (e.g. 35, 37) or conductive layers. Finally, not only do transport layers inject electron and holes into the emitter layer but, by proper choice of materials, they can prevent the leakage of the carriers back out of the emitter layer. For example, if the inorganic nanoparticles 140 were composed of $ZnS_{0.5}Se_{0.5}$ and the transport layers were composed of ZnS, then the electrons and holes would be confined to the emitter layer by the ZnS potential barrier. Suitable materials for the p-type transport layer include II-VI and III-V semiconductors. Typical II-VI semiconductors are ZnSe, ZnS, or ZnTe. Only ZnTe is naturally p-type, while ZnSe and ZnS are n-type. To get sufficiently high p-type conductivity, additional p-type dopants should be added to all three materials. For the case of II-VI p-type transport layers, possible candidate dopants are lithium and nitrogen. For example, it has been shown in the literature that $Li_3N$ can be diffused into ZnSe at ~350° C. to create p-type ZnSe, with resistivities as low as 0.4 ohm-cm (S. W. Lim, Applied Physics Letters 65, 2437 (1994)).

Suitable materials for n-type transport layers include II-VI and III-V semiconductors. Typical II-VI semiconductors are ZnSe or ZnS. As for p-type transport layers, to get sufficiently high n-type conductivity, additional n-type dopants should be added to the semiconductors. For the case of II-VI n-type transport layers, possible candidate dopants are the Type III dopants of Al, In, or Ga. As is well known in the art, these dopants can be added to the layer either by ion implantation (followed by an anneal) or by a diffusion process (P. J. George et al., Applied Physics Letter 66, 3624 [1995]). A more preferred route is to add the dopant in-situ during the chemical synthesis of the nanoparticle. Taking the example of ZnSe particles formed in a hexadecylamine (HDA)/TOPO coordinating solvent (M. A. Hines et al., Journal of Physical Chemistry B102, 3655 [1998]), the Zn source is diethylzinc in hexane and the Se source is Se powder dissolved in TOP (forming TOPSe). If the ZnSe were to be doped with Al, then a corresponding percentage (a few percent relative to the diethylzinc concentration) of trimethylaluminum in hexane would be added to a syringe containing TOP, TOPSe, and diethylzinc. In-situ doping processes, like these, have been successfully demonstrated when growing thin films by a chemical bath deposition process (J. Lee et al., Thin Solid Films 431-432, 344 [2003]).

The invention has been described in detail with particular reference to certain preferred embodiments thereof, but it will be understood that variations and modifications can be effected within the spirit and scope of the invention.

| PARTS LIST | |
|---|---|
| 1, 2, 3, 4, 5, 6 | lightrays |
| 8 | Electroluminescent device |
| 10 | substrate |
| 11 | LED |
| 12 | cover |
| 14 | electrode |
| 16 | EL unit |
| 18 | electrode |
| 20 | thin-film electronic components |
| 21 | light-scattering layer |
| 22 | spacer elements |
| 24 | light scattering particles |
| 26 | light-emitting area |
| 28 | end cap |
| 30 | sealant |
| 31 | semiconductor matrix |
| 32 | gap |
| 33 | light-emitting layer |
| 35, 37 | charge transport layers |
| 39 | light-emitting quantum dots |
| 40 | columns between light-emitting areas |
| 42 | rows between light-emitting areas |
| 50a, 50b | light |
| 60, 62, 64, 66, 68 | pixels |
| 100 | light-emitting core |
| 110 | shell |
| 115 | organic ligands |
| 120 | quantum dots |
| 140 | inorganic conductive nanoparticles |
| W1 | width |
| W2 | width |

The invention claimed is:

1. An electroluminescent device comprising:
   a substrate;
   one or more light-emitting elements formed over the substrate, the one or more light-emitting elements including first and second spaced-apart electrodes wherein at least one of the first and second electrodes is transparent and a light-emitting layer comprising quantum dots formed between the first and second electrodes;
   a cover located over the one or more light-emitting elements and spaced apart from the one or more light-emitting elements to form a gap between the cover and the one or more light-emitting elements; and
   separately formed elastic compressible spacer elements located in the gap between the cover and the one or more light-emitting elements and wherein the spacer elements are in physical contact with the one or more light-emitting elements, the cover, or both the one or more light-emitting elements and the cover.

2. The electroluminescent device of claim 1, wherein the light-emitting layer is a polycrystalline inorganic light-emitting layer comprising core/shell quantum dots within an inorganic semiconductor matrix.

3. The electroluminescent device of claim 1, wherein the light-emitting layer is a hybrid light-emitting layer comprising core/shell quantum dots within an organic semiconductor matrix.

4. The electroluminescent device of claim 1, wherein the first electrode lies over the substrate, the light-emitting layer lies over the first electrode on the side of the first electrode opposite the substrate, and the second electrode is the transparent electrode and lies over the light-emitting layer on the side of the light-emitting layer opposite the first electrode.

5. The electroluminescent device of claim 1, wherein further comprising light-scattering particles located on the transparent electrode on the side of the transparent electrode opposite the light-emitting layer.

6. The electroluminescent device of claim 1, wherein at least one of the electrodes is a patterned electrode defining independently controlled, spatially separated, light-emitting areas.

7. The electroluminescent device of claim 6, wherein the spacer elements are located in the light-emitting areas.

8. The electroluminescent device of claim 6, wherein the spacer elements are located between the light-emitting areas.

9. The electroluminescent device of claim 1, wherein the gap is maintained at a pressure of less than one atmosphere.

10. The electroluminescent device of claim 1, wherein the gap has an optical index lower than the optical index of any of the components of the one or more light-emitting elements.

11. The electroluminescent device of claim 1, wherein the spacer elements are selected from the group of titanium dioxide, polymer, barium oxide, calcium, and calcium oxide.

12. The electroluminescent device of claim 1, wherein the spacer elements are transparent.

13. The electroluminescent device of claim 1, wherein the spacer elements are affixed to the cover or to one or more light-emitting elements with an adhesive.

14. The electroluminescent device of claim 13, wherein the adhesive is patterned.

15. The electroluminescent device of claim 1, wherein the spacer elements are spherical, cylindrical, or randomly shaped particles.

16. The electroluminescent device of claim 1, wherein the spacer elements have a refractive index greater than the refractive index of any component of the light-emitting element 17. An electroluminescent device comprising:
    a substrate;
    one or more light-emitting elements formed over the substrate, the one or more light-emitting elements including first and second spaced-apart electrodes wherein at least one of the first and second electrodes is transparent and a light-emitting layer comprising quantum dots formed between the first and second electrodes;
    a cover located over the one or more light-emitting elements and spaced apart from the one or more light-emitting elements to form a gap between the cover and the one or more light-emitting elements; and
    separately formed spacer elements located in the gap between the cover and the one or more light-emitting elements and wherein the spacer elements are in physical contact with the one or more light-emitting elements, the cover, or both the one or more light-emitting elements and the cover, wherein the separately formed spacer elements have a first average size and wherein the device further comprises separately formed light-scattering particles, wherein the light-scattering particles have a second average size smaller than the first average size, and are located in the gap, in contact with the one or more light-emitting elements and located between the spacer elements.

18. The electroluminescent device of claim 17, wherein the light-scattering particles and the spacer elements are deposited from a common dispersion.

19. An electroluminescent device comprising:
    a substrate;
    one or more light-emitting elements formed over the substrate, the one or more light-emitting elements including first and second spaced-apart electrodes wherein at least one of the first and second electrodes is transparent and a light-emitting layer comprising quantum dots formed between the first and second electrodes;
    a cover located over the one or more light-emitting elements and spaced apart from the one or more light-emitting elements to form a gap between the cover and the one or more light-emitting elements; and
    separately formed spacer elements having a cross section greater than 1 micron located in the gap between the cover and the one or more light-emitting elements and wherein the spacer elements are in physical contact with the one or more light-emitting elements, the cover, or both the one or more light-emitting elements and the cover.

* * * * *